United States Patent
Kudo et al.

(10) Patent No.: US 7,492,434 B2
(45) Date of Patent: Feb. 17, 2009

(54) DISPLAY DEVICE HAVING AN ANISOTROPIC-CONDUCTIVE ADHESIVE FILM

(75) Inventors: Kiyofumi Kudo, Kanagawa (JP); Futoshi Nakanishi, Kanagawa (JP)

(73) Assignee: NEC LCD Technologies, LTD. (JP)

( * ) Notice: Subject to any disclaimer, the term of this patent is extended or adjusted under 35 U.S.C. 154(b) by 337 days.

(21) Appl. No.: 11/462,112

(22) Filed: Aug. 3, 2006

(65) Prior Publication Data

US 2007/0030433 A1    Feb. 8, 2007

(30) Foreign Application Priority Data

Aug. 4, 2005    (JP)    ............... 2005-226794

(51) Int. Cl.
  *G02F 1/1345*    (2006.01)
(52) U.S. Cl. ...................................... 349/152; 349/149
(58) Field of Classification Search .................. 349/149, 349/152
  See application file for complete search history.

(56) References Cited

U.S. PATENT DOCUMENTS

2005/0041189 A1*    2/2005    Hong et al. ................ 349/149

FOREIGN PATENT DOCUMENTS

| CN | 1467552 | 1/2004 |
|---|---|---|
| JP | 05-070750 | 3/1993 |
| JP | 6-102523 | 4/1994 |
| JP | 2001-119116 | 4/2001 |
| JP | 2004-118164 | 4/2004 |
| WO | WO 2005/045851 | 5/2005 |

* cited by examiner

*Primary Examiner*—David Nelms
*Assistant Examiner*—Phu Vu
(74) *Attorney, Agent, or Firm*—Hayes Soloway P.C.

(57) ABSTRACT

A liquid crystal display (LCD) device includes a LCD panel and a flexible wiring member coupled together by an anisotropic-conductive adhesive film (ACF). The ACF includes insulating resin and a plurality of conductive particles dispersed therein and each having an insulating film on a conductive body. The insulating film is broken by the thermal compression of the ACF during manufacture of the LCD device, thereby allowing terminals of the LCD panel and terminals of the flexible wiring member to be electrically coupled together.

11 Claims, 9 Drawing Sheets

DISPLAY DEVICE HAVING AN ANISOTROPIC-CONDUCTIVE ADHESIVE FILM

BACKGROUND OF THE INVENTION (a) Field of the Invention

The present invention relates to a display device having an anisotropic-conductive adhesive film and, more particularly, to a display device including a display panel and a flexible wiring member bonded onto the display panel by using an anisotropic-conductive adhesive film.

(b) Description of the Related Art

Display devices, such as a LCD device, include a display panel and a drive unit including a driver IC electrically coupled to the display panel for driving the display panel. The drive unit includes a flexible wiring substrate or flexible wiring member, on which the driver IC is mounted using a tape-automated-bonding (TAB) technique. The flexible wiring member, on which the driver IC is fixed, is coupled at an end thereof onto an edge portion of the display panel, and is folded onto the rear surface of the display panel for mounting the driver IC on the rear side of the display panel. This configuration reduces the planar size of the resultant display device.

FIG. 12 shows a sectional view of a conventional LCD device, as a typical example of the display device, which includes a LCD panel and a flexible wiring member bonded onto the LCD panel. The LCD panel 10 includes an active-matrix substrate 11 on which an array of active devices such as TFTs (thin-film transistors) are formed, a color-filter substrate 12 opposing the active-matrix substrate 11, and a liquid crystal (LC) layer (not shown) sandwiched between the active-matrix substrate 11 and the color-filter substrate 12. An edge of the active-matrix substrate 11 protrudes from the corresponding edge of the color-filter substrate 12, and a plurality of terminals (first terminals) 16 are formed in the vicinity of the edge of the active-matrix substrate 11.

The flexible wiring member 20 includes a base substrate or base film 21, a plurality of wires 22 formed on the base substrate 21, and an overcoat film 23 covering the wires 22 on the base substrate 21. The overcoat film 23 terminates at the location which is D3 distance apart from the edge of the active-matrix substrate 11, whereby the wires exposed from the overcoat film 23 configure exposed terminals (second terminals) 24 in the vicinity of the end of the flexible wiring member 20.

The flexible wiring member 20 is bonded onto the LCD panel 10 by an anisotropic-conductive adhesive film (ACF) 30 sandwiched between the terminals 16 (first terminals) of the LCD panel 10 and the terminals (second terminals) 24 of the flexible wiring member 20. The ACF 30 is such that conductive particles 32 are dispersed in insulating resin 31 having a thermo-setting or thermoplastic property, whereby the insulating resin 31 mechanically fixes the second terminals 24 onto the first terminals 16, and the conductive particles 32 electrically connect the second terminals 24 to the first terminals 16.

Upon coupling the flexible wiring member 20 onto the LCD panel 10, the ACF 30 obtained by filming anisotropic-conductive adhesive is sandwiched between the first terminals 16 and the second terminals 24 for temporarily fixing thereof and then subjected to a thermo-compression bonding process. In the thermo-compression bonding process, the insulating resin is cured when the ACF 30 is being compressed so that the conductive particles contact both the terminals 16 and 24. The connection bonding using the ACF 30 obviates connection of individual terminals 24 to respective terminals 16, thereby simplifying connection of the terminals.

If there is a level difference or step difference in the area of the ACF 30 during the connection boding using the anisotropic-conductive adhesive, the step difference may impede fluidity of the conductive particles 32. This may cause an alignment of the conductive particles in contact with one another along the extending direction of the edge of the step. For example, if the distal edge 25 of the overcoat film 23 is located in the vicinity of the edge 17 of the active-matrix substrate 11 or inside of the edge portion of the active-matrix substrate 11, as shown in FIG. 13, the fluidity of the conductive particles 32 is impeded by the edge 25 of the overcoat film 23, thereby causing the conductive particles 32 to align with one another in the extending direction of the edge 25 of the overcoat film 23. The alignment of the conductive particles 32 in contact with one another will cause a short-circuit failure between adjacent terminals.

For avoiding the short-circuit failure caused by the alignment of the conductive particles, it is necessary to secure a sufficient distance D3, as shown in FIG. 12, between the edge 17 of the active-matrix substrate 11 and the edge 25 of the overcoat film 23 in the conventional technique. The sufficient distance D3, however, may allow a foreign object or foreign particle to be attached onto the exposed wires or may cause corrosion of the exposed wires 22 in the flexible wiring member 20. This may also cause a short-circuit failure.

For avoiding the short-circuit failure between adjacent terminals, another insulating film may be formed on the exposed terminals 24; however, it increases the process steps and raises the cost of the LCD device.

Patent Publication JP-2004-118164A describes a technique for solving the above problem, wherein the overcoat film protrudes within the space between adjacent terminals to expose the terminals, and the ACF is formed in the entire area of the exposed terminals.

The technique described in the patent publication suppresses the short-circuit failure caused by the alignment of the conductive particles because the conductive particles are distributed along the extending directions of the three edges of the protrusion of the overcoat film. However, reduction of the pitch of the terminals in the current semiconductor devices makes it difficult to employ the configuration of the overcoat film having the protrusion in the space between adjacent terminals while exposing the terminals.

SUMMARY OF THE INVENTION

In view of the above problems in the conventional technique, it is an object of the present invention to provide a display device capable of suppressing a short-circuit failure between adjacent terminals.

The present invention provides a display device including: a display panel mounting thereon a plurality of first terminals: a flexible wiring member including a plurality of second terminals corresponding to the first terminals; and an anisotropic-conductive adhesive film (ACF) for electrically and mechanically coupling together the first terminals and the second terminals, the ACF including insulating resin and a plurality of conductive particles dispersed in the insulating resin, the conductive particles including first particles each having an exposed surface having an insulating property on at least a portion of the exposed surface.

In accordance with the present invention, the insulating property of the exposed surface of the first particles in the conductive particles prevents a short-circuit failure between adjacent terminals caused by alignment of the conductive particles in contact with one another, while assuring electric contact between the first terminals and the second terminals after thermal compression of the ACF.

The above and other objects, features and advantages of the present invention will be more apparent from the following description, referring to the accompanying drawings.

PREFERRED EMBODIMENT OF THE INVENTION

Figure 1:
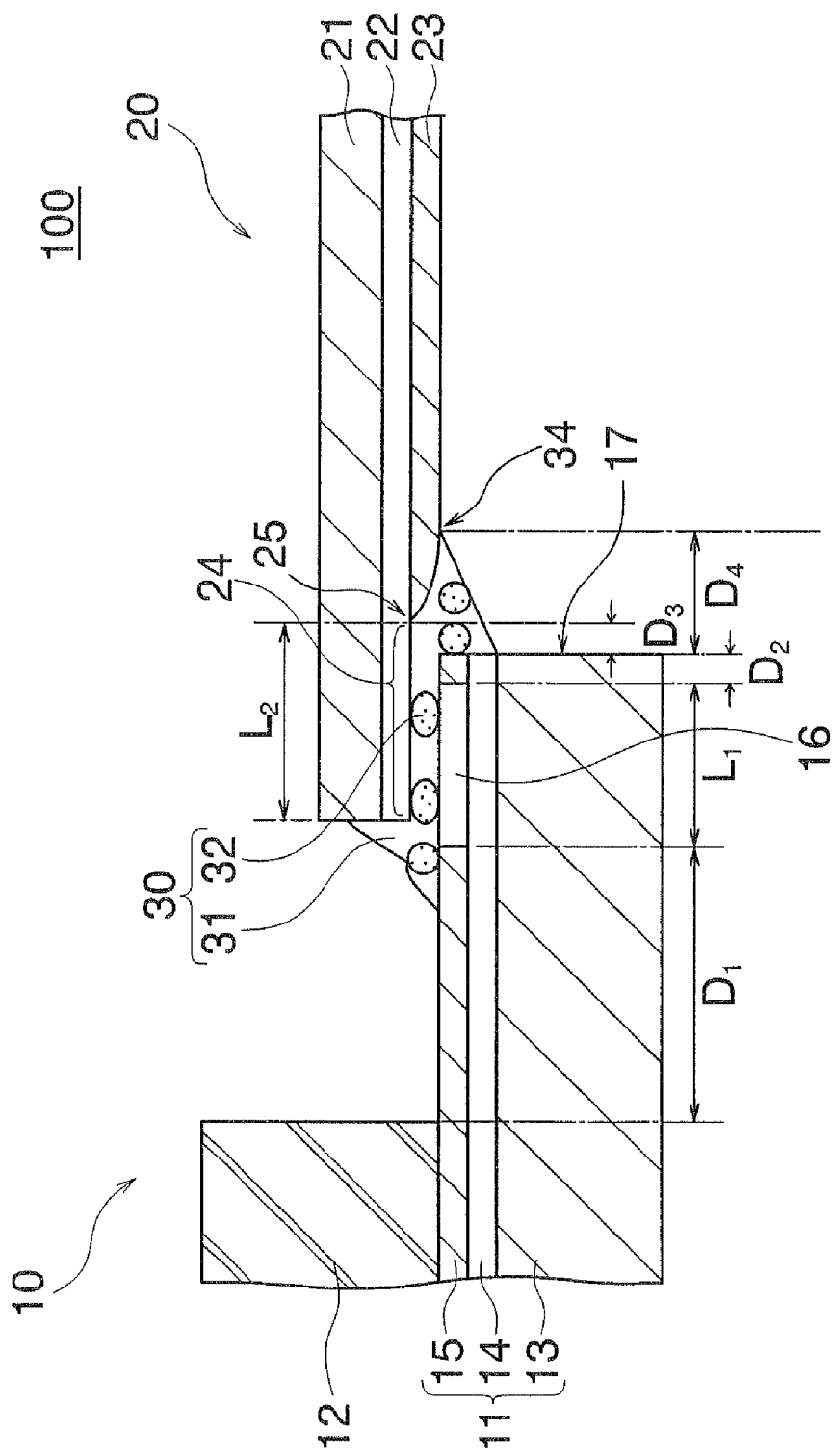
FIG. 1 is a partial sectional view of a display device (LCD device) according to a first embodiment of the present invention.

Before describing embodiments of the present invention, the principle of the present invention will be described for a better understanding of the present invention. The inventors first noticed the technique described in Patent Publication JP-1993-70750, wherein an ACF used for mounting an IC chip onto a mounting pattern includes conductive particles each including an insulating film formed on a conductive film covering a resin core.

In the technique described in the above publication, the thermal compression of the ACF between terminals breaks a portion of the insulating film of the conductive particles to expose a portion of the conductive film in contact with both the terminals and thus electrically connect the terminals together via the portion of the conductive film. The other portion of the insulating film remaining on the conductive film isolates adjacent conductive particles from each other, thereby preventing a short-circuit failure between adjacent terminals if a plurality of conductive particles align in contact with one another in a row between the adjacent terminals. The term "adjacent terminals" as used herein means adjacent terminals formed on either the IC chip or the mounting pattern.

It should be noted however that the pitch and dimensions of the terminals in the technique used for mounting an IC chip onto the mounting pattern as described above are significantly smaller than those of the terminals used in the technique of the LCD devices using the flexible wiring member. The smaller dimensions of the terminals in the technique described in the above publication necessitates a higher density of the conductive particles in the ACF. The higher density of the conductive particles may involve a short-circuit failure between adjacent terminals due to aggregation of the conductive particles between the adjacent terminals. Thus, the above technique uses an insulating film formed on the conductive particles. In short, the insulating film on the conductive particles is generally considered effective only to the above technique for mounting the IC chip having smaller terminals.

In the technique of the LCD device using the flexible wiring member, the pitch and the dimensions of the terminals are significantly larger than those of the above IC-chip mounting technique. Thus, the gap between adjacent terminals is significantly larger in the technique of the LCD device using the ACF, and the ACF used therein has a lower density of the conductive particles. There is no known report of the problem that aggregation or alignment of the conductive particles involves a short-circuit failure between adjacent terminals.

It is noticed by the present inventors however that the conductive particles having such an insulating film thereon may be used for the technique of the LCD device using the flexible wiring member having a larger pitch and larger dimensions of the terminals, in order to suppress the short-circuit failure caused by alignment of the conductive particles in contact with one another between adjacent terminals due to a step difference.

A variety of experiments conducted by the present inventors revealed that the short-circuit failure caused by the step difference can be effectively suppressed by using the ACF including conductive particles having thereon an insulating film.

An ACF used in the experiments included two types of conductive particles including first conductive particles having thereon an insulating film and second conductive particles having thereon no insulating film. Another ACF included a single type of conductive particles including an insulating film on a part of the conductive film. Another ACF also included a single type of conductive particles having thereon a plurality of minute insulator pieces on the conductive film.

It is to be noted that the IC-chip mounting technique uses terminals each having a connection area of 1,600 to 5,000 $\mu^2$, and arranged with a gap of about 15 $\mu$m, and that the flexible wiring member in the LCD device uses terminals each having a connection area of 10,000 to 25,000 $\mu m^2$, and arranged with a gap of 20 to 25 $\mu$m. In addition, the gap between adjacent terminals in the LCD device is equal to or larger than about four times the diameter (mean diameter, for example) of the conductive particles in the ACF. Thus, the technique used in the IC-chip mounting process would be considered unnecessary in the process of the LCD device.

Now, the present invention is more specifically described with reference to accompanying drawings, wherein similar constituent elements are designated by similar reference numerals throughout the drawings.

FIG. 1 shows an edge portion of a display device (LCD device) according to a first embodiment of the present invention. The LCD device, generally designated by numeral 100, includes an active-matrix LCD panel 10, and a plurality of flexible wiring members 20 each used as a wiring substrate for mounting a driver IC driving the LCD panel 10.

The LCD panel 10 includes an active-matrix substrate 11, a color-filter substrate 12 opposing the active-matrix substrate 11, and a LC layer (not shown) sandwiched between the active-matrix substrate 11 and the color-filter substrate 12. The active-matrix substrate 11 includes a plurality active devices, such as TFTs each disposed for controlling one of an array of pixels. The color-filter substrate 12 includes color filters each for one of the pixels.

The active-matrix substrate 11 includes a glass substrate body 13, on which a plurality of conductive leads (leads) 14 are formed to connect to TFTs. The leads 14 extend normal to the extending direction of the edge 17 of the active-matrix substrate 11 and arranged in the extending direction of the edge 17. The leads 14 are covered by an insulating film 15. The active-matrix substrate 11 protrudes from the edge of the color-filter substrate 12, and the insulating film 15 is exposed on the edge portion of the active-matrix substrate 11 from the edge of the color-filter substrate 12.

A portion of the leads 14 is exposed from the insulating film 15 to configure terminals (first terminals) 16, which are made of ITO (indium-tin-oxide), extend normal to edge 17 of the active-matrix substrate 11, and are arranged along the extending direction of the edge 17.

The first terminals 16 are 1.5 mm long (L1) and 25 μm wide, and arranged at a pitch of 50 μm, for example. For example, the distance D1 between the edge of the color-filter substrate 12 and the edge of the terminals 16 is 1 mm, and the distance D2 between the edge 17 of the active-matrix substrate 11 and the edge of the terminals 16 is 0.3 mm.

The flexible wiring member 20 includes a base film 21, a plurality of wires 22 formed on the base film 21, and an overcoat film 23 made of solder resist covering the wires 22 on the base film 21. The overcoat film 23 is formed on the base film 21 by coating and drying an insulating resin such as urethane. The wires 22 are made from a thin copper film, and plated with tin, or alloy including nickel and gold. The base film 21 and overcoat film 23 each function as a protective film protecting the wires 22 against a mechanical force and corrosion thereof.

The overcoat film 23 has a distal edge 25 apart from the edge of the flexible wiring member 20, and exposes therefrom terminals (second terminals) 24 of the wires 22. Terminals 24 are arranged at a pitch equal to the pitch of terminals 16 of the active-matrix substrate 11. Terminals 24 are 1.8 mm long (L2) and 25 μm wide, for example.

The flexible wiring member 20 is bonded onto the LCD panel 10, with the first terminals 16 and the second terminals 24 opposed each other, by using an ACF 30 disposed between the first terminals 16 and the second terminals 24. In the present embodiment, the ACF 30 covers the entire exposed portion of terminals 24 of the flexible wiring member 20 and a portion of the overcoat film 23. The distance D3 between the edge 17 of the active-matrix substrate 11 and the distal edge 25 of the overcoat film 23 is about 0.1 mm, and the distance D4 between the edge 17 of the active-matrix substrate 11 and the edge 34 of the ACF 30 is about 0.3 mm. It is to be noted that, in the conventional technique, distances D3 and D4 are about 0.3 mm and 0.1 mm, respectively, for example, that is D3>D4.

The ACF 30 is made from anisotropic-conductive adhesive wherein conductive particles 32 are dispersed in insulating resin 31 having a thermo-setting or thermo-plastic property. The conductive particles 32 in the ACF 30 contact both the first terminals 16 and the second terminals 24, to electrically connect the first terminals 16 and the second terminals 24 together. The insulating resin 31 mechanically fixes the first terminals 16 and the second terminals 24 together. The conductive particles 32 include two types of particles including first particles having an insulating film on a conductive surface, and a second particles having an exposed conductive surface, as will be detailed hereinafter.

Figure 2B:
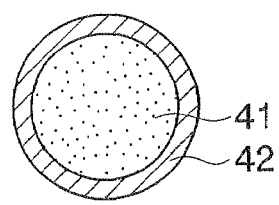
FIGS. 2A and 2B are sectional views of two types of the conductive particles contained in the anisotropic-conductive adhesive used in the LCD device of FIG. 1.
Figure 2A:
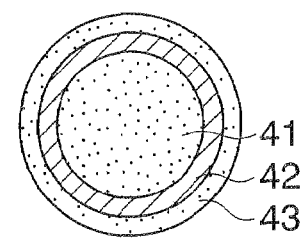

FIGS. 2A and 2B show the first and second conductive particles, respectively. The first particle 32A includes a particulate resin 41, a conductive film 42 covering the particulate resin 41, and an insulting film 43 covering the conductive film 42. The second particle 32B includes a particulate resin 41 and a conductive film 42 covering the particulate resin 41. For example, the particulate resin 41 has a diameter of about 5 μm, the conductive film 42 has a thickness of about 0.2 μm, and the insulating film 43 has a thickness of about 0.2 μm. The conductive particles 32 include first particles 32A and second particles 32B substantially at a ratio of fifty-to-fifty, or at a higher percents for the first particles 32A.

Figure 3:
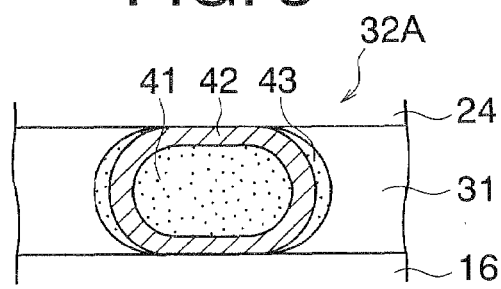
FIG. 3 is a sectional view of the conductive particle of FIG. 2A after installation thereof.

FIG. 3 shows one of the first particles 32A in the ACF 30 after installation thereof in the LCD device. The compressive force applied to the first particles 32A in the ACF 30 breaks a portion of the insulating film 43 in contact with the surface of the terminals 16 and 24, thereby allowing the exposed conductive film 42 to electrically connect the terminals 16 and 24 together.

Figure 4:
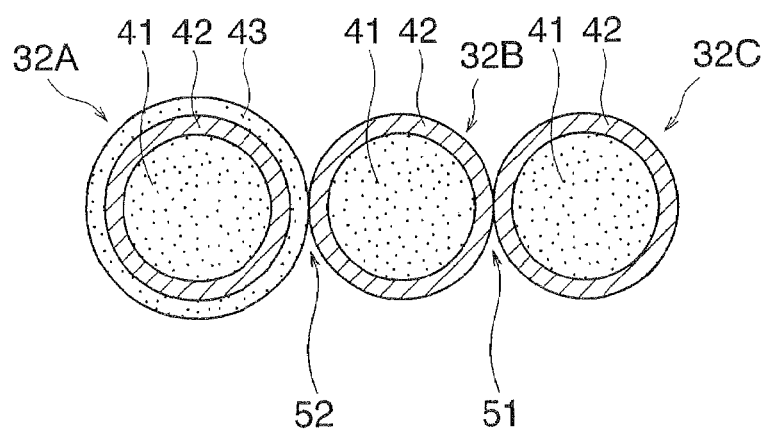
FIG. 4 is a sectional view showing alignment of the conductive particles in a row.

In the LCD device 100 according to the present embodiment, as shown in FIG. 4, the conductive particles 32 in the ACF 30 may align in contact with one another in the extending direction of the edge 25 of the overcoat film 23 between adjacent terminals 24. However, alignment of these conductive particles 32 in contact with one another does not cause a short-circuit failure between adjacent terminals, because of the presence of one or more of the first particle 32A among a group of conductive particles 32 disposed between the adjacent terminals. This is assured by the presence of the first particles 32A in number equal to or above 50% of the total number of the conductive particles 32. In FIG. 4, adjacent conductive particles 32 are electrically isolated at numeral 52 by the insulating film 43, whereas adjacent conductive particles 32 are electrically connected together at numeral 51.

A situation may be supposed to happen wherein the thermal compression does not effectively break the insulating film 43 of the first particles 32A to thereby cause a higher electric resistance between the first terminals 16 and the second terminals 24. However, the ratio of 20% to 50% of the second particles 32B in the conductive particles 32 will be sufficient to obtain a suitable contact resistance between the first terminals 16 and the second terminals 24.

The configuration wherein the terminals 24 of the flexible wiring member 20 are entirely covered by the ACF 30 assures absence of the attachment of foreign particles and occurring of corrosion on the terminals 24. Thus, the LCD device 100 does not suffer from a short-circuit failure involved in the conventional LCD device.

Figure 5:
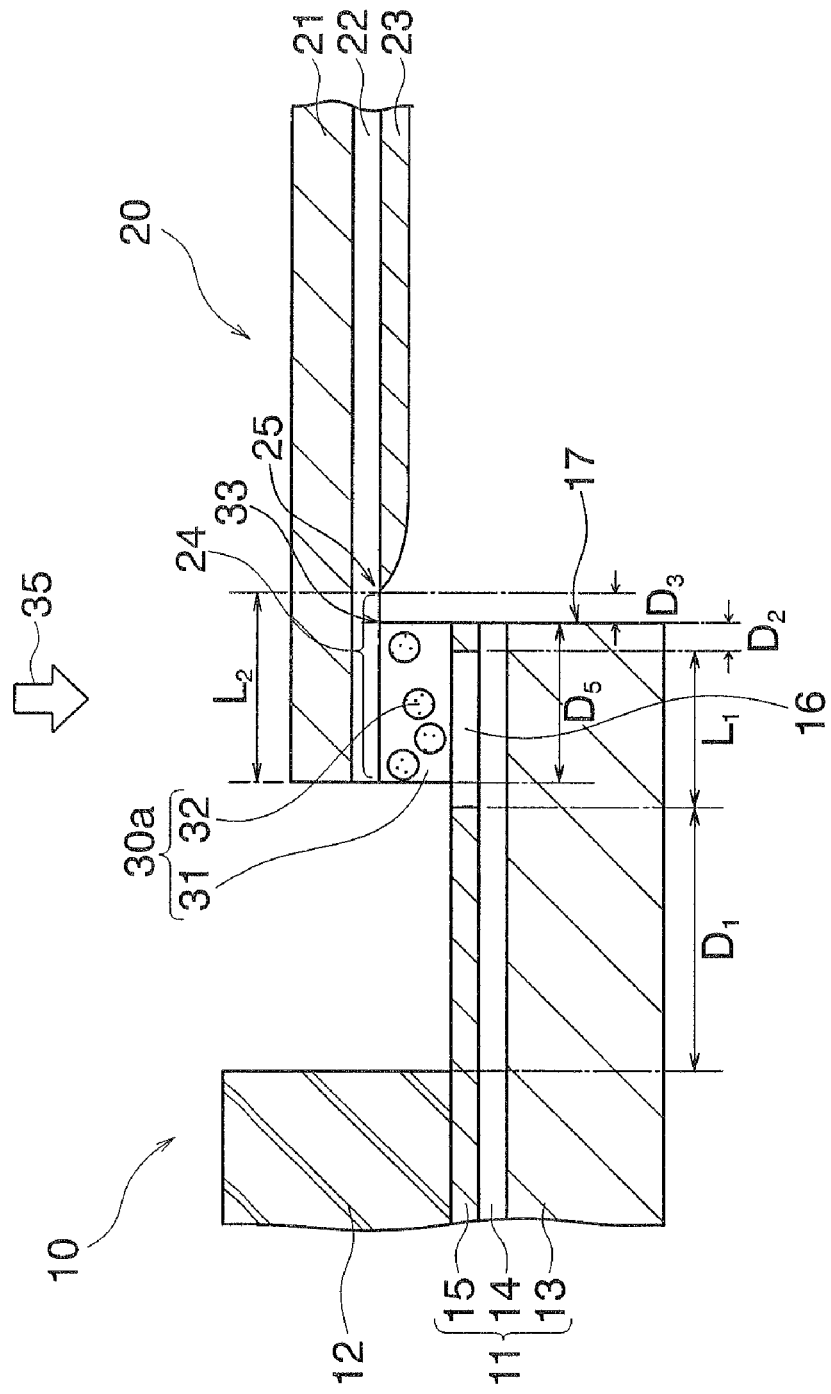
FIG. 5 is a sectional view of the LCD device of FIG. 1 in a step of fabrication thereof.

FIG. 5 shows a step of fabrication process for the LCD device 100 of FIG. 1. In fabrication of the LCD device 100, the LCD panel 10 and flexible wiring member 20 are separately manufactured, and the ACF 30a is bonded onto the LCD panel 10 to cover the entire area of the first terminals 16, with an edge of the ACF 30a being aligned with the edge 17 of the active-matrix substrate 11 and the opposing edge of the ACF 30a located at a distance (D5) of 1.5 mm apart from the edge 17 of the active-matrix substrate 11. The ACF 30a is configured by filming anisotropic-conductive adhesive, has a thickness of 15 μm, and includes conductive particles at 5 to 20 volume percent of the ACF 30a.

The terminals 24 of the flexible wiring member 20 are then adjusted for position alignment with respect to the LCD panel 11, and temporarily fixed thereto by using the adhesion property of the ACF 30a, thereby obtaining the structure shown in FIG. 5. In this temporary fixation, the distance (D3) between the edge of the ACF 30a, or edge 17 of the active-matrix substrate 11, and the edge 25 of the overcoat film 23 is set at 0.1 mm. In an alternative, the ACE 30a may be first fixed onto the terminals 24 of the flexible wiring member 20, followed by temporarily fixing the LCD panel 10 onto the ACF 30a.

A thermal compression process is then conducted to press the ACF 30a between the first terminals 16 and the second terminals 24 with a pressure applied in the direction of arrow 35. The thermal compression process hardens the ACF 30a while maintaining the sufficient contact between the first terminals 16 and the second terminals 24, and breaks a portion of the insulating film 43 in contact with the terminals 16 and 24 to expose therefrom the conductive film 42. The control of the pressure or compression force deforms the conductive particles 32 between the first terminals 16 and the second terminals 24 with a suitable degree and thus obtains a sufficient contact area therebetween.

The thermal compression process increases the width of the ACF 30a to move the edge 33 thereof by 0.3 mm toward the flexible wiring member 20. This allows the ACF 30a to cover the entire exposed portion of the terminals 24 of the flexible wiring member 20 and a portion of the overcoat film 23, as shown in FIG. 1.

In the fabrication process as described above, the distal edge 25 of the overcoat film 23 may impede the fluidity of the conductive particles 32, thereby allowing the conductive particles 32 in the ACF 30a to align in contact with one another in the extending direction of the edge 25 of the overcoat film 23. The presence of the first particles 32A in the conductive particles at a ratio of 50% or above allows adjacent terminals to be insulated from each other, by inserting at least one first particle 32A among a group of conductive particles 32 aligned between the adjacent terminals.

Figure 13:
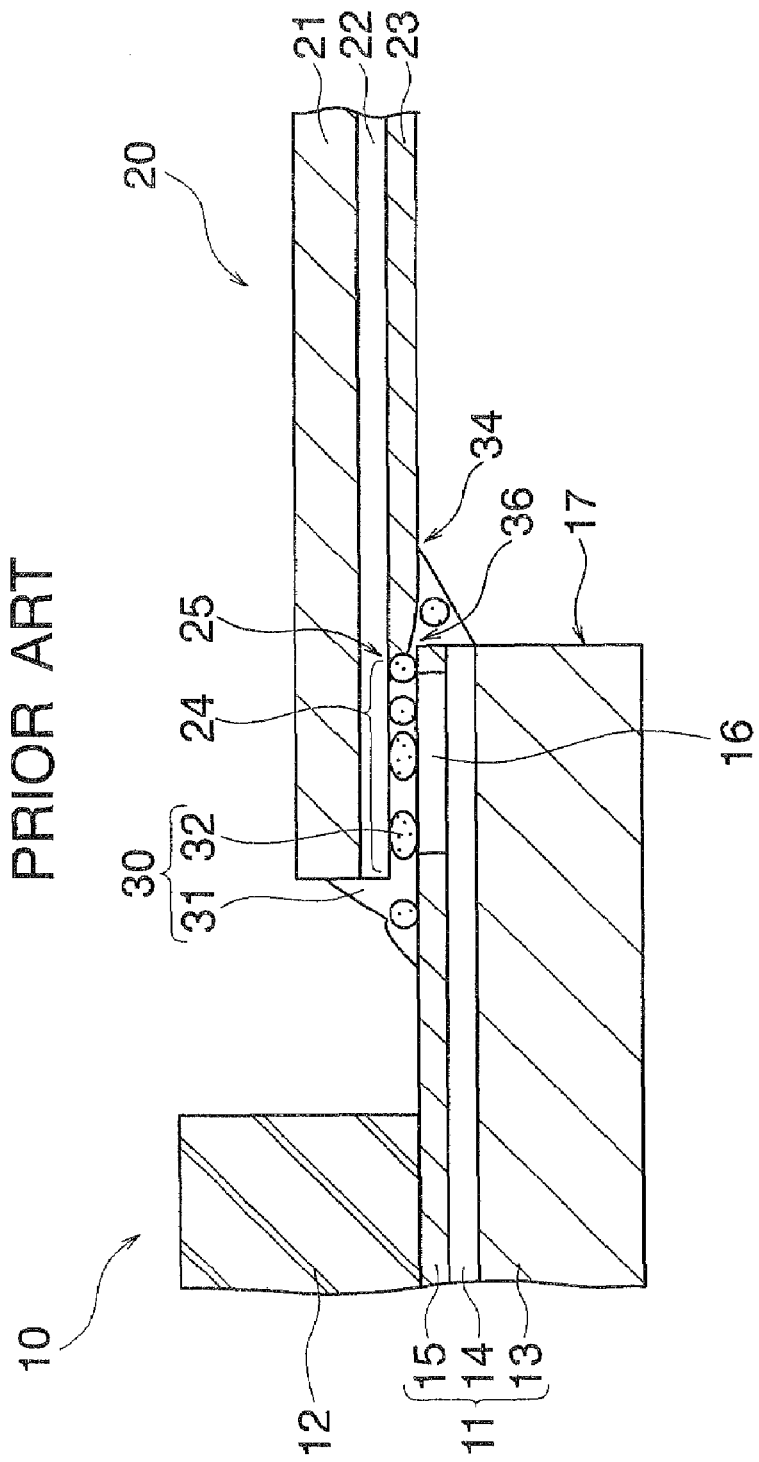
FIG. 13 is a partial sectional view of another conventional LCD device.

In the present embodiment, the edge 25 of the overcoat film 23 may be located inside the edge portion of the active-matrix substrate 11, as in the conventional LCD device shown in FIG. 13. In this case, the gap 36 between the active-matrix substrate 11 and the overcoat film 23 is smaller than that in the above embodiment, thereby causing conductive particles 32 to align in contact with one another along the extending direction of the edge 25 of the overcoat film 23. However, the presence of the first particles 32A at 50% or above of the conductive particles 32 in the ACF 30a assures isolation between adjacent terminals.

Figure 6:
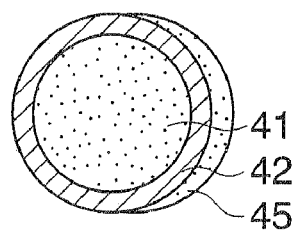
FIG. 6 is a sectional view of the conductive particle in a LCD device according to a first modification from the first embodiment.

FIG. 6 shows one of the conductive particles in the ACF of a LCD device according to a first modification from the first embodiment. The ACF includes a single type of conductive particles such as the conductive particle 37 shown in FIG. 6. The conductive particle 37 is similar to the first particle 32A shown in FIG. 2A except that the conductive particle 37 has a semi-spherical insulating film 45, i.e., an insulating film 45 covering about 50% of the entire surface of the conductive film 42 in this modification.

In manufacture of the conductive particles 37 in this modification, negative resist is used to coat the entire surface of the conductive film 42, and exposed to exposure light from a single direction to harden the exposed portion of the negative resist. Development of the exposed negative resin allows the un-exposed portion thereof to be removed from the conductive particles 37.

Figure 7:
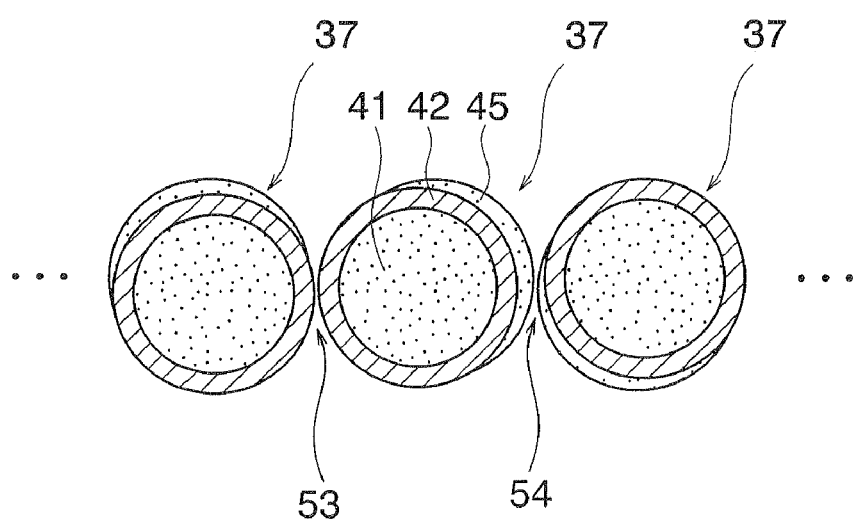
FIG. 7 is a sectional view of the conductive particles of FIG. 6 aligned in a row.

In the first modification, if the conductive particles are aligned in contact with one another in one direction, as shown in FIG. 7, the remaining portion of the semi-spherical insulating film 45 in one or more of the conductive particles 37 will isolate the adjacent terminals. It will be noted in FIG. 7 that adjacent conductive particles 37 are isolated from each other at numeral 54, whereas adjacent conductive particles 37 are in electric contact with each other at numeral 53. A single isolation, which may be assured by the presence of the semi-spherical insulating film 45, achieves the isolation between adjacent terminals. The semi-spherical insulating film 45 is also broken by the compression force applied to the ACF 30 between the first terminals 16 and the second terminals 24. The negative resist may be replaced by positive resist in a further modification.

Figure 8:
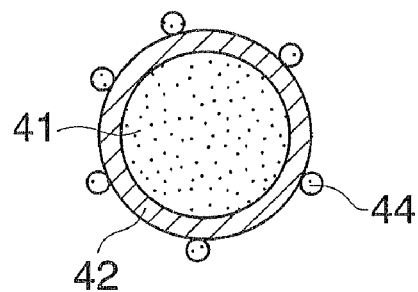
FIG. 8 is a sectional view of the conductive particle in a LCD device according to a second modification from the first embodiment.

FIG. 8 shows one of the conductive particles in the ACF is of a LCD device according to a second modification from the first embodiment. The ACF includes a single type of conductive particles such as the conductive particle 38 shown in FIG. 8. The conductive particle 38 is similar to the first particle 32A shown in FIG. 2A except that the conductive particle 38 in this modification includes a plurality of minute insulator pieces 44 attached onto the surface of the conductive film 42 instead of the insulating film 43 in FIG. 2A. The minute insulator pieces 44 are made of thermo-setting or thermo-plastic resin. The minute insulator pieces 44 have a diameter of 0.5 µm, for example, and adheres onto the surface of the conductive film 42 by an adhesion property of the minute insulator pieces 44.

In manufacture of the conductive particles 38 in this modification, after the conductive film 42 is formed on the particulate resin 41, the resultant conductive particles 38 are mixed with a large number of minute insulator pieces 44 for fixing the minute insulator pieces 44 onto the surface of the conductive film 42 by using the adhesion property of the minute insulator pieces 44. The thermal compression force applied between the LCD panel 10 and the flexible wiring member 20 deforms the minute insulator pieces 44 for assuring the electric contact between the first terminals 16 and the second terminals 24.

Figure 9:
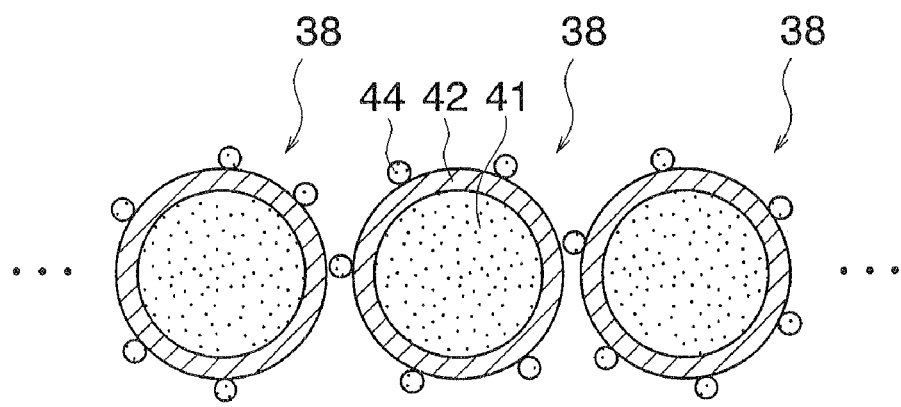
FIG. 9 is a sectional view of the conductive particles of FIG. 8 aligned in a row.

In this modification, if the conductive particles 38 are aligned in contact with one another between adjacent terminals, adjacent conductive particles 38 are isolated from each other by the minute insulator pieces 44, as shown in FIG. 9, thereby preventing a short-circuit failure between the adjacent terminals, while assuring the electric contact between the first terminals 16 and the second terminals 24. It is to be noted that conductive particles 32A, 32B, 37, 38 shown in FIGS. 2A, 2B, 6 and 8 may have a metallic core, such as made of nickel, instead of using the particulate resin and the covering conductive film.

Figure 10:
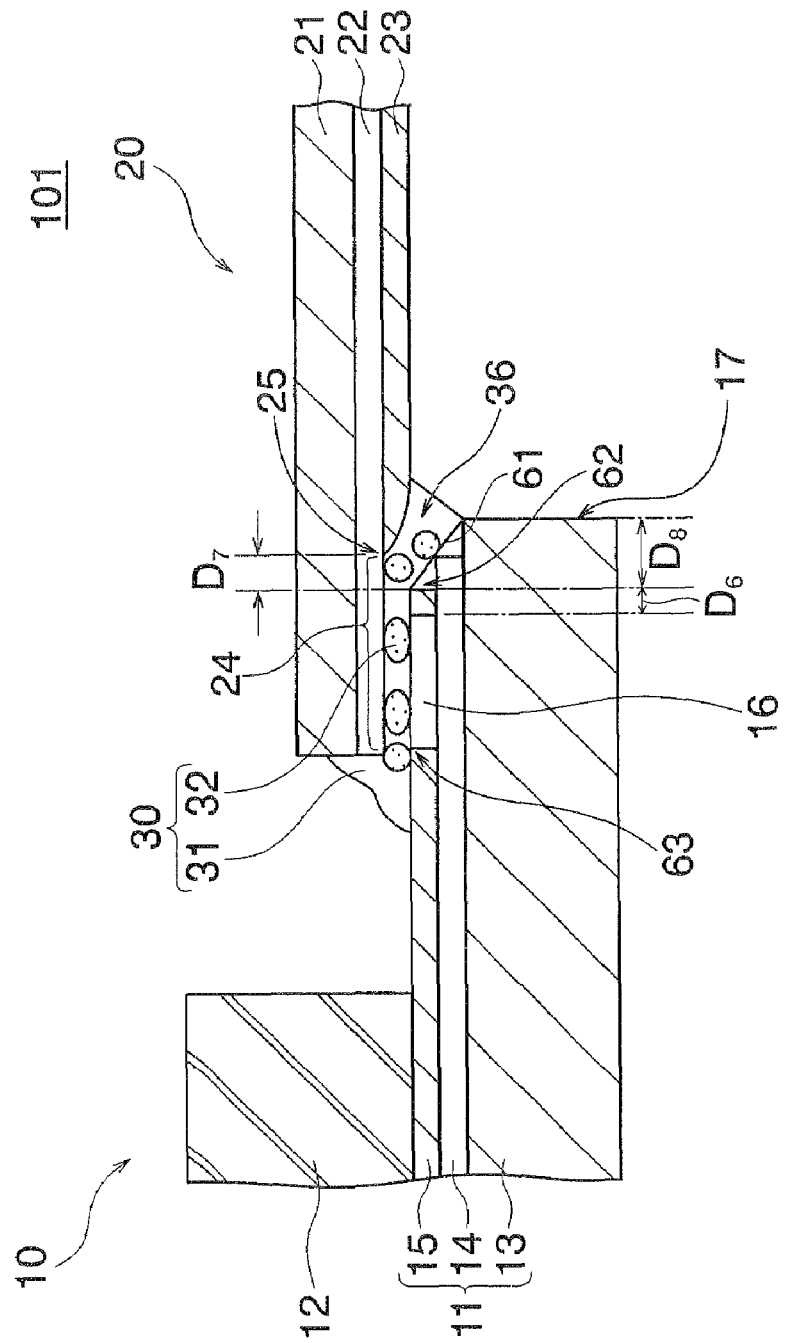
FIG. 10 is a partial sectional view of a display device (LCD device) according to a second embodiment of the present invention.

FIG. 10 shows a LCD device according to a second embodiment of the present invention. The LCD device, generally designated by numeral 101, has a chamfer 61 formed on the edge portion of the active-matrix substrate 11 onto which the flexible wiring member 20 is fixed. For example, the distance (D6) between the proximal edge 62 of the chamfer 61 and the terminals 16 is 0.3 mm, the distance (D7) between the proximal edge 62 of the chamfer 61 and the distal edge 25 of the overcoat film 23 is 0.1 mm, and the distance (D8) between the width of the chamfer 61 as measured parallel to the surface of the substrates (substrate surface) is 0.3 mm. The surface of the chamfer 61 is at 30 degrees away from the substrate surface, for example.

The ACF 30 covers the entire terminals 24 of the flexible wiring member 20 and a portion of the overcoat film 23, and extends toward the edge 17 of the active-matrix substrate 11, after the thermal compression process. The LCD device 101 is similar to the LCD device 100 of FIG. 1 except for the configurations as described above.

In manufacture of the LCD device 101 of the present embodiment, after the chamfer 61 is formed on the edge portion of the active-matrix substrate 11, the ACF 30 is bonded onto the active-matrix substrate 11 between the proximal edge 63 of the terminals 16 and the proximal edge 62 of the chamfer 61.

In the present embodiment, since the gap 36 between the chamfer 61 and the overcoat film 23 is substantially uniform in the widthwise direction of the chamfer 61, the distal edge of the ACF 30 moves toward the edge 17 of the active-matrix substrate 11 due to the capillary function of the gap 36 upon the thermal compression. Thus, even if the anisotropic-conductive resin in the ACF 30 has a poor fluidity, the ACF 30 will cover the entire terminals 24 of the flexible wiring member 20. The gap 36 also allows the conductive particles 32 to move smoothly along the gap 36, thereby preventing alignment of the conductive particles in a row between adjacent terminals.

The chamfer 61 extending parallel to the distal edge 25 of the overcoat film 23 allows the flexible wiring member 20 to be bent with ease around the edge 17 of the active-matrix substrate 11 toward the rear surface thereof, substantially without a significant bending stress applied to the flexible wiring member 20 and the ACF 30.

Figure 11:
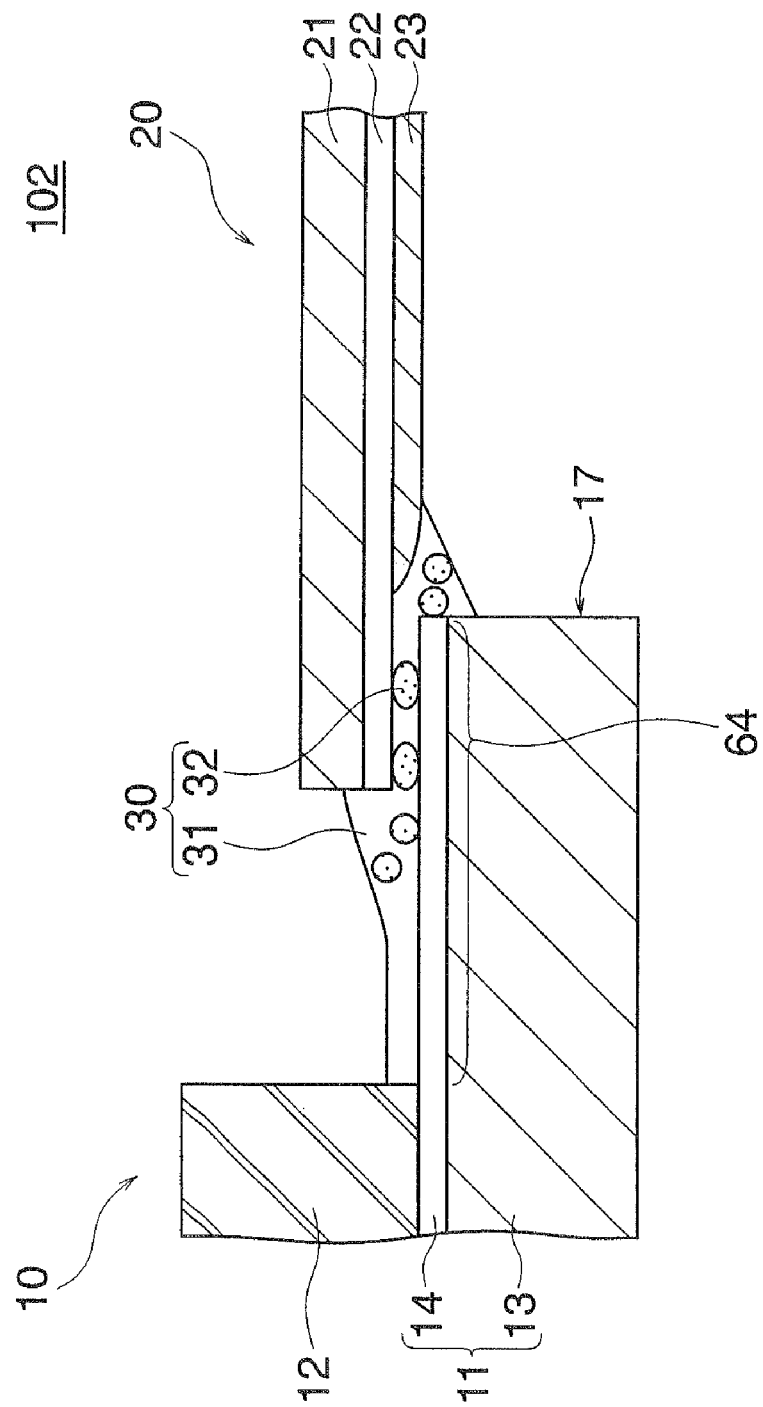
FIG. 11 is a partial sectional view of a display device (LCD device) according to a third embodiment of the present invention.
Figure 12:
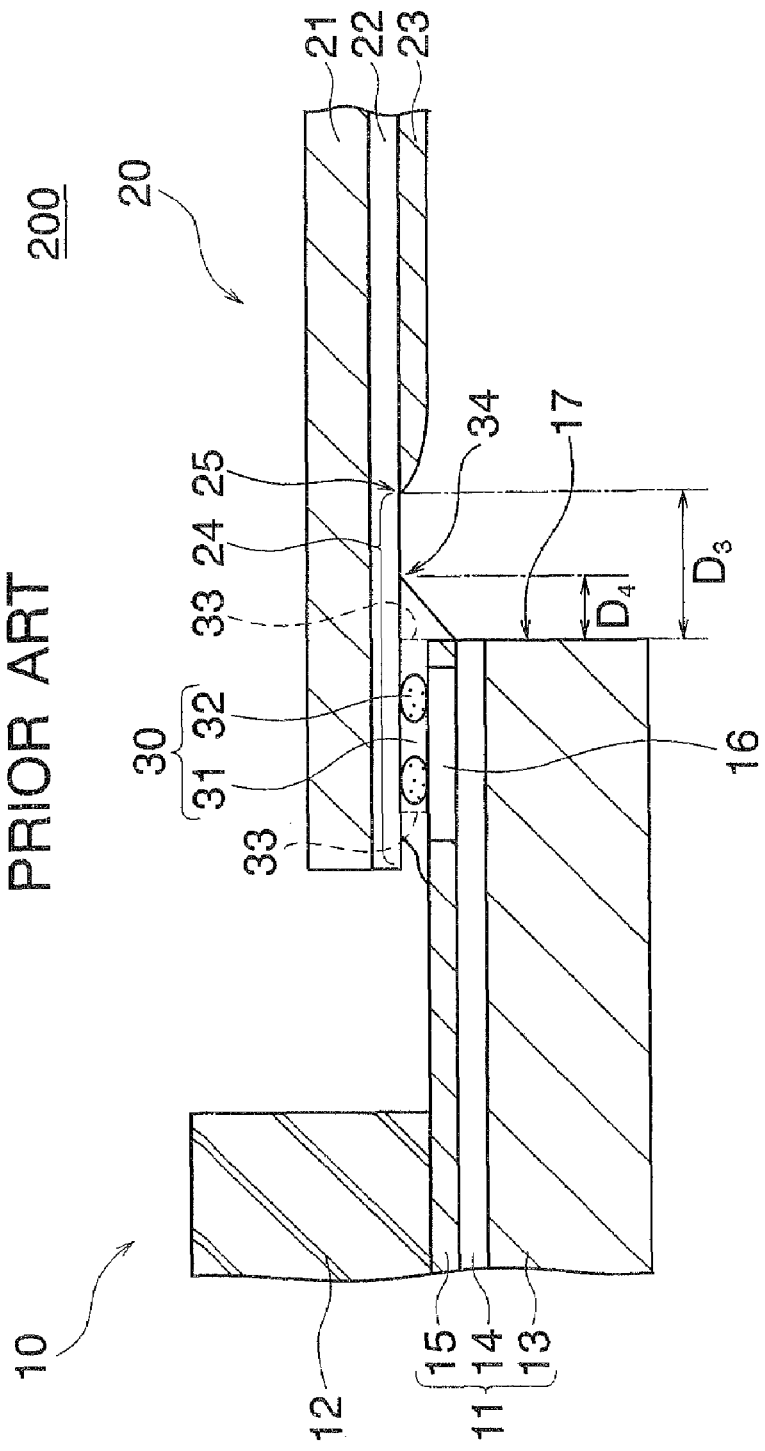
FIG. 12 is a partial sectional view of a conventional LCD device.

FIG. 11 shows a LCD device according to a third embodiment of the present invention. The LCD device, generally designated by numeral 102, includes exposed leads 14 which configure terminals 64 at the end thereof. The ACF 30 covers the exposed leads 14 in the area between the edge of the color-filter substrate 12 and the edge 17 of the active-matrix substrate 11. The LCD device 102 is similar to the LCD device 100 of FIG. 1 except for these configurations.

In manufacture of the LCD device 102, the end portion of the leads 14 are not covered with an insulating film, and the end portion of the leads 14 configure terminals 64 without using an additional treatment of the leads 14. The ACF 30 is bonded onto the active-matrix substrate 11 between the edge of the color-filter substrate 12 and the edge 17 of the active-matrix substrate 11.

The process for manufacturing the LCD device 102 of the present embodiment obviates the steps of forming an insulating film on the leads 14 and configuring the end portion of the leads 14 to form the terminals, thereby simplifying the process. The ACF 30 in the LCD devices 101 and 102 of the above embodiments includes first and second particles shown in FIGS. 2A and 2B, or in an alternative, may include conductive particles 37 or 38 such as shown in FIG. 6 or 8.

Since the above embodiments are described only for examples, the present invention is not limited to the above embodiments and various modifications or alterations can be easily made therefrom by those skilled in the art without departing from the scope of the present invention.

What is claimed is:

1. A display device comprising:
a display panel mounting thereon a plurality of first terminals:
a flexible wiring member including a plurality of second terminals corresponding to said first terminals; and
an anisotropic-conductive adhesive film (ACF) for electrically and mechanically coupling together said first terminals and said second terminals,
said ACF including insulating resin and a plurality of conductive particles dispersed in said insulating resin, said conductive particles including first particles each having an exposed surface having an insulating property on at least a portion of said exposed surface.

2. The display device according to claim 1, wherein said conductive particles include said first particles in number 50% or more of the total number of said conductive particles.

3. The display device according to claim 1, wherein each of said first particles includes a conductive body and an insulating film covering said conductive body.

4. The display device according to claim 3, wherein said conductive body includes an insulator core and a conductive film covering said insulator core.

5. The display device according to claim 1, wherein each of said first particles includes a conductive body and a plurality of insulator pieces attached onto a surface of said conductive body.

6. The display device according to claim 5, wherein said conductive body includes an insulator core and a conductive film covering said insulator core.

7. The display device according to claim 1, wherein said first and second terminals are arranged at a pitch which is equal to or above four times as large as a mean diameter of said conductive particles.

8. The display device according to claim 1, wherein said ACF covers at least an exposed portion of wires adjacent said second terminals of said flexible wiring member.

9. The display device according to claim 1, wherein said ACF covers at least an exposed portion of interconnects adjacent said first terminals of said display panel.

10. The display device according to claim 1, wherein said display panel has a chamfer on an edge thereof adjacent said first terminals.

11. The display device according to claim 1, wherein said display panel is a liquid crystal display panel.

* * * * *